(12) United States Patent
Koo

(10) Patent No.: US 8,956,950 B2
(45) Date of Patent: Feb. 17, 2015

(54) METHOD OF MANUFACTURING SEMICONDUCTOR DEVICES

(75) Inventor: Min Gyu Koo, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 294 days.

(21) Appl. No.: 13/416,019

(22) Filed: Mar. 9, 2012

(65) Prior Publication Data

US 2012/0231599 A1    Sep. 13, 2012

(30) Foreign Application Priority Data

Mar. 9, 2011   (KR) .................. 10-2011-0020837

(51) Int. Cl.
| | | |
|---|---|---|
| H01L 21/76 | (2006.01) | |
| H01L 27/115 | (2006.01) | |
| H01L 21/02 | (2006.01) | |
| H01L 21/266 | (2006.01) | |

(52) U.S. Cl.
CPC ...... *H01L 27/11524* (2013.01); *H01L 21/0206* (2013.01); *H01L 21/266* (2013.01)
USPC ........... 438/427; 438/424; 438/587; 438/593; 438/666; 438/700

(58) Field of Classification Search
CPC .................. H01L 27/11582; H01L 27/11556; H01L 29/7926; H01L 27/11578; H01L 21/28273; H01L 27/11521; H01L 27/11524; H01L 27/1157; H01L 29/66825; H01L 29/792; H01L 27/11551; H01L 21/0337; H01L 21/76229; H01L 27/11568; H01L 21/31144; H01L 27/10876; H01L 27/1052; H01L 21/3086; H01L 21/32139; H01L 21/76877; H01L 27/11529

USPC ....... 257/E29.3, E29.262, E21.645, E21.546, 257/365, E21.179, E21.24, E21.257, 257/E21.54, E29.264, 331; 438/424, 666, 438/400, 427, 593, 700, 587

See application file for complete search history.

(56) References Cited

U.S. PATENT DOCUMENTS

| | | | | |
|---|---|---|---|---|
| 6,645,813 | B1 * | 11/2003 | Hsieh ............................ | 438/257 |
| 6,645,851 | B1 * | 11/2003 | Ho et al. ....................... | 438/626 |
| 7,071,517 | B2 * | 7/2006 | Kim et al. ..................... | 257/382 |
| 2007/0066003 | A1 * | 3/2007 | Hur et al. ...................... | 438/201 |
| 2007/0096202 | A1 * | 5/2007 | Kang et al. .................... | 257/324 |
| 2011/0165750 | A1 * | 7/2011 | Yang et al. .................... | 438/287 |
| 2011/0316165 | A1 * | 12/2011 | You et al. ...................... | 257/773 |
| 2014/0035043 | A1 * | 2/2014 | Lee et al. ...................... | 257/365 |

FOREIGN PATENT DOCUMENTS

| | | | |
|---|---|---|---|
| KR | 1020040056436 | A | 7/2004 |
| KR | 1020090077300 | A | 7/2009 |
| KR | 10-2010-0013952 | A | 2/2010 |

* cited by examiner

*Primary Examiner* — Bac Au
(74) *Attorney, Agent, or Firm* — William Park & Associates Patent Ltd.

(57) ABSTRACT

A method of manufacturing semiconductor devices includes forming a plurality of patterns spaced apart from each other on a semiconductor substrate, forming a filling layer, not removed in a subsequent process of forming a mask pattern and where the filling layer formed to have a lower height than the plurality of patterns, between the plurality of patterns, forming a mask layer on the entire structure where the filling layer is formed, and forming the mask pattern by removing some of the mask layer so that some of the plurality of patterns is removed.

19 Claims, 6 Drawing Sheets

METHOD OF MANUFACTURING SEMICONDUCTOR DEVICES

CROSS-REFERENCE TO RELATED APPLICATION

This application claims priority to Korean patent application number 10-2011-0020837 filed on Mar. 9, 2011, the entire disclosure of which is incorporated by reference herein.

BACKGROUND

1. Field of the Invention

Embodiments disclosed herein relate generally to a method of manufacturing semiconductor devices and, more particularly, to a method of manufacturing semiconductor devices, including a process of forming mask patterns.

2. Description of the Related Art

A semiconductor device is formed by a plurality of processes of forming mask patterns. The process of forming mask patterns may include depositing a mask layer and removing the selected region of the mask layer. The mask layer may be a photoresist layer or may be a layer patterned by a photolithography process. If the mask layer is a photoresist layer, a photolithography process may be performed to remove selected regions of the mask layer in order to form mask patterns. The photolithography process includes a process of forming the photoresist layer, an exposure process for the selected region of the photoresist layer, a development process of removing the exposed region or the non-exposed region of the photoresist layer, and a cleaning process. The photolithography process may form the photoresist pattern is formed. The photoresist pattern may play the role of an etch mask or may be used as mask patterns in an etch process for removing the selected region of the mask layer. The mask patterns may play the role of an etch mask in an etch process for removing the selected region of a specific layer or may play the role of an impurity implantation mask in an impurity implantation process.

The mask patterns may be part of a region where a plurality of patterns is formed that may create openings. When openings are formed within a plurality of patterns, some or all of the plurality of patterns may collapse or incline.

FIGS. 1A and 1B are cross-sectional views illustrating a prior art process of forming mask patterns comprising openings, where the formation of the openings may lead to collapsed or inclined patterns.

Referring to FIG. 1A, a plurality of spaced patterns 3 is formed over a semiconductor substrate 1. A mask layer 5 is formed on the entire structure in which the plurality of patterns is formed. An example where the mask layer 5 is a photoresist layer is described below for convenience of description.

Referring to FIG. 1B, after the selected region of the photoresist layer 5 is exposed, depending on whether the photoresist is a positive or negative type, either the exposed region or the non-exposed region of the photoresist layer 5 is removed using a developer. A cleaning process is then performed to form a mask pattern (that is, a photoresist pattern 5a) through which the region where the plurality of patterns 3 is formed is opened. If the photoresist layer 5 is a positive type, the exposed region of the photoresist layer 5 is removed. If the photoresist layer 5 is a negative type, the non-exposed region of the photoresist layer 5 is removed.

When the exposed region or the non-exposed region of the photoresist layer 5 is removed, a developer dissolves the exposed region or the non-exposed region of the photoresist layer 5. The developer is filled in an interval or space between the patterns 3 in a region from which the photoresist layer will be removed and then discharged. In the process of removing the photoresist, the patterns 3 may collapse or incline because of interfacial tension generated by the application of the developer.

Furthermore, if wet cleaning using a cleaning agent is performed after forming the photoresist pattern 5a, the cleaning agent is filled in the interval between the patterns 3 and then discharged. The patterns 3 may be collapse or incline because of interfacial tension created by the cleaning agent.

The plurality of patterns 3 may be cell gates of a NAND flash memory device. The photoresist pattern 5a may be an impurity implantation mask for blocking regions other than a memory cell region. The cell gates may be formed in a subsequent process of forming cell junctions by implanting impurities into the semiconductor substrate 1 between the cell gates.

As described above, the phenomenon in which the patterns 3 inclines or collapses typically occurs when the aspect ratio of each of the patterns 3 becomes 10:1 or higher. Revolution per minute (RPM) may be reduced when the developer or the cleaning agent is discharged, but to prevent incline or collapse of the patterns, changing the RPM when cleaning or developing leads to insubstantial improvement.

BRIEF SUMMARY

Example embodiments relate to a method of manufacturing semiconductor devices, which is capable of improving deformation of shapes of a plurality of patterns formed in a process of forming mask patterns by filling a portion of an interval between the plurality of patterns with a filling layer.

A method of manufacturing semiconductor devices according to an aspect of the present disclosure includes forming a plurality of patterns spaced apart from each other on a semiconductor substrate, forming a filling layer, not removed in a subsequent process of forming a mask pattern and where the filling layer is formed to have a lower height than the plurality of patterns, between the plurality of patterns, forming a mask layer on the entire structure where the filling layer is formed, and forming the mask pattern by removing some of the mask layer so that some of the plurality of patterns is removed.

A method of manufacturing semiconductor devices according to another aspect of the present disclosure includes forming a first gate and a second gate over a substrate, wherein the first gate is arranged in a first region of the substrate, and the second gate is arranged in a second region of the substrate; forming a filling layer, having a lower height than the first gate and the second gate, between the first gate and the second gate adjacent to each other, and between the second gates; forming a mask pattern blocking the top surface of the first region and opening the top surface of the second region; and implanting impurities into the second region of the semiconductor substrate by performing an impurity implantation process through the filling layer exposed by the mask pattern.

A method of manufacturing semiconductor devices according to yet another aspect of the present disclosure includes forming the first gate and second gate over a the substrate, wherein the first gate is arranged in a first region of the substrate, and the second gate is arranged in a second region of the substrate; forming a first impurity region in the first and the second regions by a blanket impurity implantation process using the first and the second gates as a mask; forming a filling layer, having a lower height than the first and the second gates, between the first and the second gate adjacent to each other and between the second gates; forming a photoresist pattern, blocking the top surface of the first region, but opening the top surface of the second region, by a photolithography process; and forming a second impurity region in the second region by performing an impurity implantation process through the filling layer exposed by the photoresist pattern, wherein the filling layer is not removed by the photolithography process.

DESCRIPTION OF EMBODIMENTS

Hereinafter, some example embodiments of the present disclosure will be described in detail with reference to the accompanying drawings. The figures are provided to allow those having ordinary skill in the art to understand the scope of the embodiments of the disclosure.

Figure 1A:
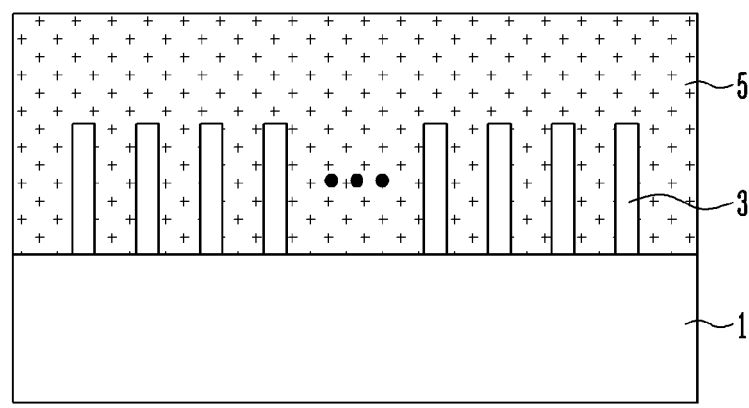
FIGS. 1A and 1B are cross-sectional views illustrating a prior art process of forming mask patterns wherein a plurality of patterns are formed.
Figure 1B:
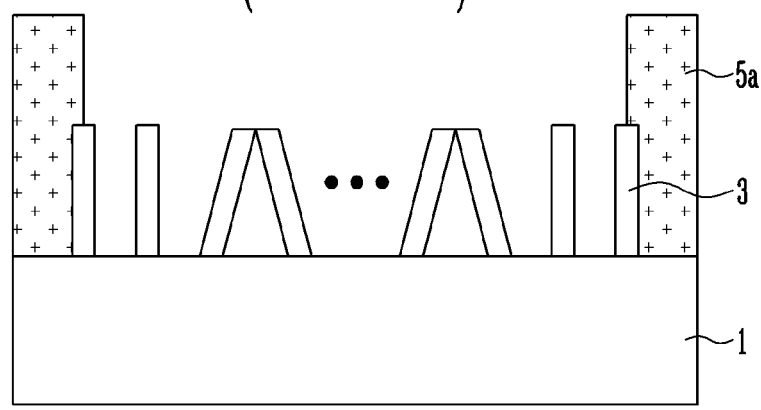
Figure 2:
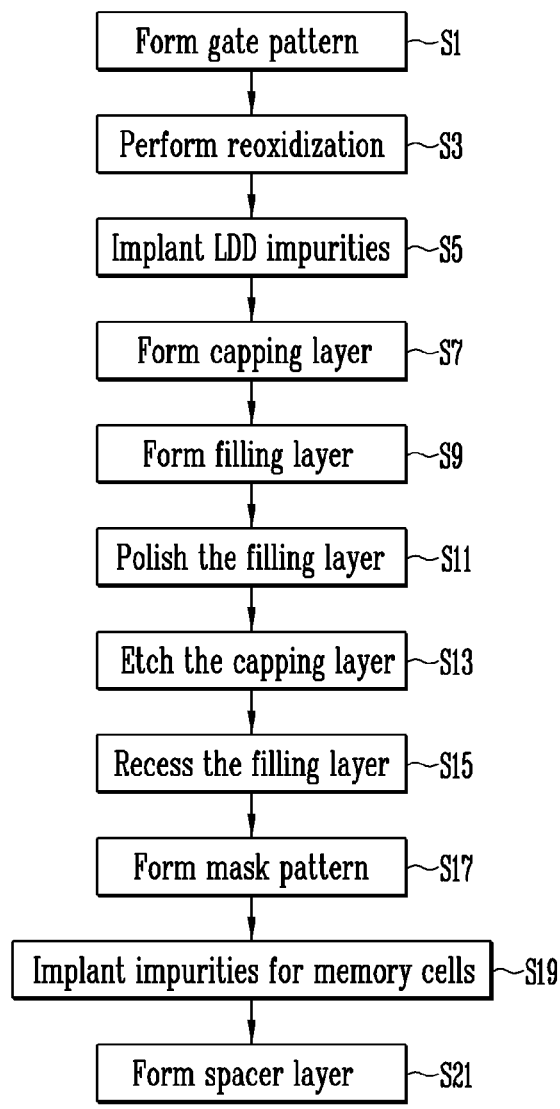
FIG. 2 is a flowchart illustrating aspects of a method of manufacturing semiconductor devices according to an embodiment of this disclosure.

FIG. 2 is a flowchart illustrating aspects a method of manufacturing semiconductor devices according to an embodiment of this disclosure, and FIGS. 3A to 3H are cross-sectional views showing a method of manufacturing semiconductor devices according to the flowchart of FIG. 2.

A method of manufacturing semiconductor devices is described in detail below. For purposes of description only, the method describes forming memory cell junctions of a NAND flash memory device. Although the method(s) is/are illustrated in the process of forming memory cell junctions of a NAND flash memory, one of ordinary skill in the art will readily appreciate that the disclosed method(s) may be used to form other types of semiconductor devices.

Figure 3A:
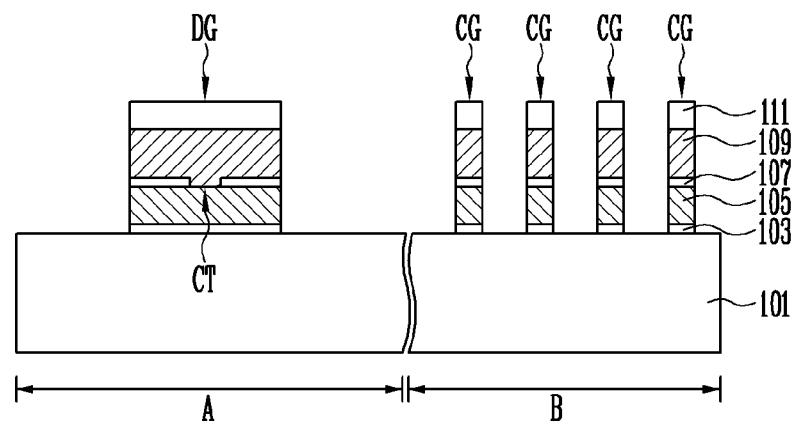
FIGS. 3A to 3H are cross-sectional views showing a method of manufacturing semiconductor devices according to the sequence of FIG. 2.

Referring to FIGS. 2 and 3A, a plurality of patterns DG and CG, spaced apart from each other with a trench interposed therebetween, is formed over a semiconductor substrate 101. A plurality of regions may be defined in the semiconductor substrate 101. In case of the NAND flash memory device, the plurality of regions includes a first region A (that is, a peripheral region) and a second region B (that is, a memory cell region). The plurality of patterns includes the first gate DG (that is, a driving gate) and the second gates CG (that is, cell gates). The peripheral region is a region where driving transistors are formed. Driving transistors may comprise a circuit element for driving memory cells where data is stored. The driving gate is the gate of the driving transistor. The memory cell region is a region where memory cells for storing data are formed. The cell gates are the gates of the memory cells.

At step S1, the first and the second gates DG and CG are formed by forming gate patterns over the semiconductor substrate 101 using a known method. The second gates CG adjacent to each other are spaced apart from each other with a space narrower than a space between the first gates DG adjacent to each other. The first and the second gates DG and CG include gate insulating layers 103, first conductive layers 105, dielectric layers 107, and second conductive layers 109 which are stacked over the semiconductor substrate 101. A gate hard mask patterns 111 may remain on each of the second conductive layers 109 of the first and the second gates DG and CG. The first conductive layer 105 and the second conductive layer 109 of the first gate DG are electrically coupled through a contact hole CT penetrating the dielectric layer 107. In the second gate CG, the dielectric layer 107 insulates the first conductive layer 105 used as a floating gate from the second conductive layer 109. The width of the second gate CG may be 30 nm or less in order to increase the degree of integration of the semiconductor devices.

An interval or space between the second gates CG adjacent to each other is larger than a width of the second gate CG, but may be less than twice the width of the second gate CG in order to increase the degree of integration of the semiconductor devices.

At step S3, a reoxidization process for removing damage to an etched surface that may have been damaged during an etch process may be performed.

Figure 3B:
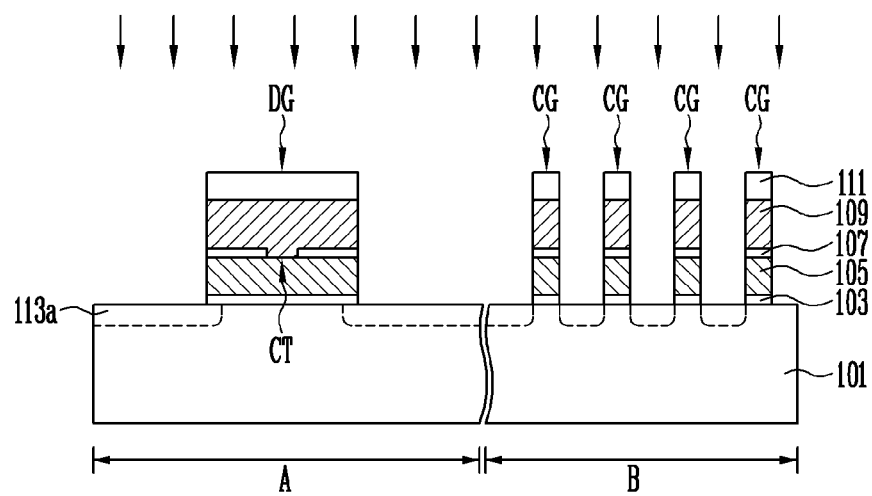

Referring to FIGS. 2 and 3B, at step S5, lightly doped drain (LDD) impurities are implanted. The implantation of the LDD impurities is a process of forming low concentration impurity regions (hereinafter referred to as 'first impurity regions 113a') of transistors having an LDD structure.

A low voltage NMOS transistor, a low voltage PMOS transistor, a high voltage NMOS transistor, etc. may be formed in the first region A. The low voltage NMOS transistor may use the LDD structure as a source or drain junction. The first region A, according to an embodiment of this disclosure, is illustrated to be the low voltage NMOS transistor using the LDD structure.

The LDD impurity implantation process is a blanket implantation process of implanting impurities into the semiconductor substrate 101 without using an impurity implantation mask. In the blanket implantation process, the first and the second gates DG and CG play the role of a mask for blocking the impurities from being implanted into the semiconductor substrate 101 under the first and the second gates DG and CG. Accordingly, the first impurity region 113a is formed not only in the first region A, but also in the second region B. The first impurity region 113a is formed in the semiconductor substrate 101 between the first gates DG adjacent to each other or between the second gates CG adjacent to each other. Furthermore, although not shown, the first impurity region 113a is also formed in regions where a low voltage PMOS transistor and a high voltage NMOS transistor may be formed.

The first impurity region 113a for the LDD structure of the low voltage NMOS transistor may be formed by implanting phosphorous (P) or arsenic (As) with a dose of 1E12 ions/cm$^2$ to 1E13 ions/cm$^2$.

If the first impurity regions 113a are formed by the blanket implantation process, the production cost can be reduced because one photolithography step can be omitted.

Figure 3C:
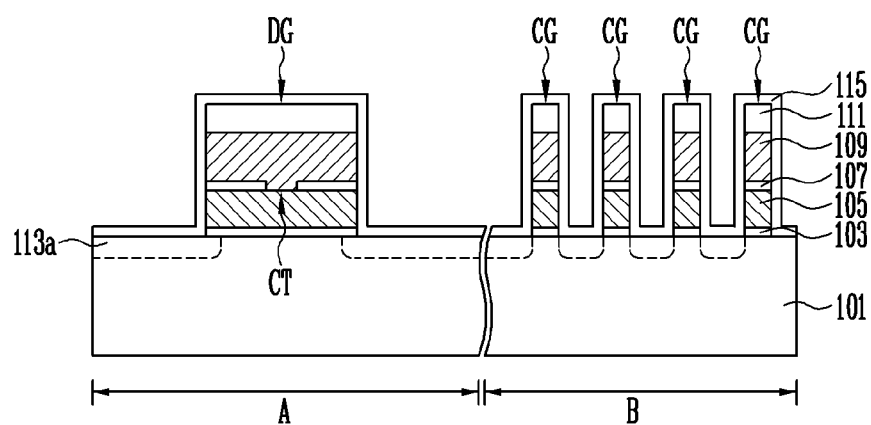

Referring to FIGS. 2 and 3C, at step S7, a capping layer 115 is formed on the exposed surfaces of the first and the second gates DG and CG and the semiconductor substrate 101. The capping layer 115 may be formed of a nitride layer in order to prevent the semiconductor substrate 101 and the first and the second gates DG and CG from being contaminated by materials from a subsequently formed filling layer. In an embodiment, the capping layer 115 may be formed in thickness of 20 Å to 50 Å in order to prevent the contaminants of the filling layer from being deposited in the semiconductor substrate 101, the first and the second gates DG and CG. The capping layer 115 configured with an appropriate thickness may also prevent a topology due to the first and the second gates DG and CG from being removed. In an embodiment, the capping layer 115 may be formed by a low pressure chemical vapor deposition (LP-CVD) method having a good step coverage characteristic.

Figure 3D:
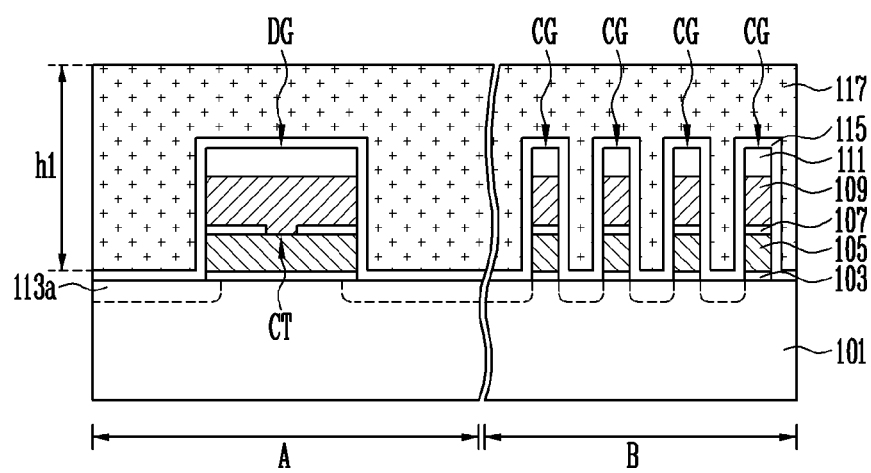

Referring to FIGS. 2 and 3D, at step S9, the filling layer 117 is filled between the first gate DG and the second gate CG nearest the first gate DG, and between the second gates CG that are adjacent to each other. The filling layer 117 has a first height h1 higher than the height of the first and the second gates DG and CG. The first height h1 of the filling layer 117 may be variously set according to the design rule of the semiconductor device. In an embodiment the filling layer 117 may be an oxide layer made of low pressure-tetraethly orthosilicate (LP-TEOS).

Figure 3E:
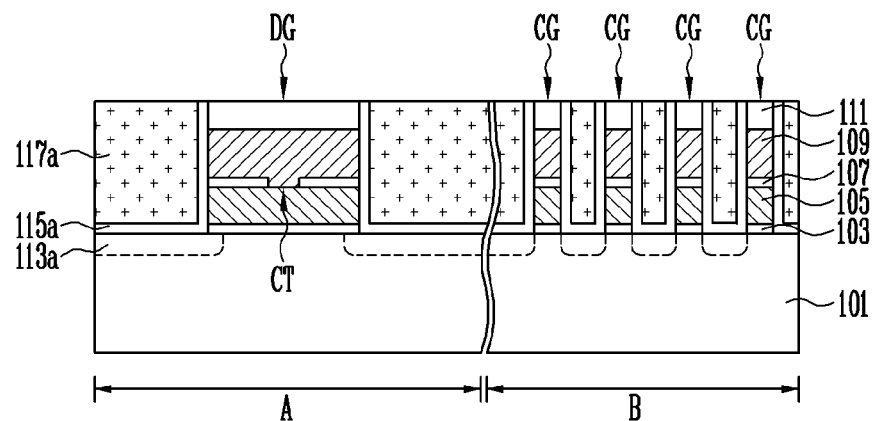

Referring to FIGS. 2 and 3E, at step S11, the filling layer 117a is polished. The filling layer 117a may be polished using a chemical mechanical polishing (CMP) method which is stopped when the capping layer 115 is exposed. If the capping layer 115 is used as the polishing-stop layer, damage to the first and the second gates DG and CG due to over-etching can be prevented. Some regions of the capping layer 115 formed over the first and the second gates DG and CG may be exposed by the filling layer 117a polished by the above described process.

At step S13, the capping layer 115 exposed over the first and the second gates DG and CG is removed by an etch process, such as etch-back. Thus, the capping layer 115a, remaining between the first and the second gates DG and CG adjacent to each other and between the second gates CG adjacent to each other, has a U shape.

Figure 3F:
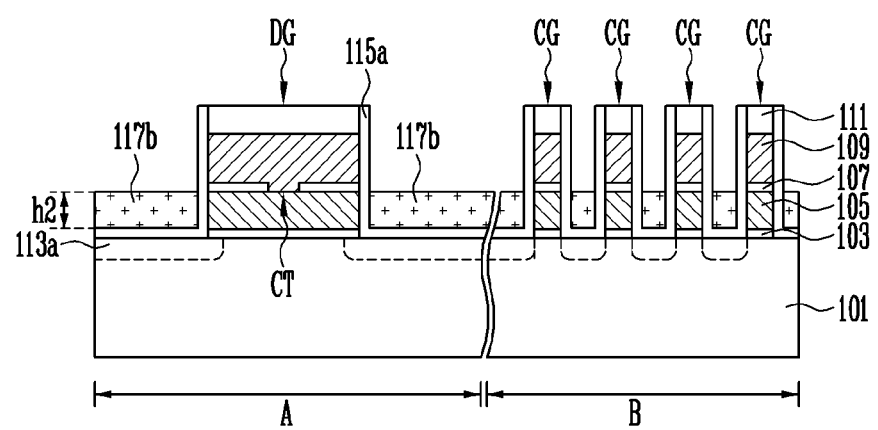

Referring to FIGS. 2 and 3F, at step S15, a filling layer 117b, having a second height h2 lower than the height of the first and the second gates DG and CG, is formed by recessing the polished filling layer 117a using a wet method. The second height h2 of the filling layer 117b be formed in thickness of 100 Å to 500 Å so that deformation of the second gates CG due to interfacial tension generated in a subsequent mask pattern formation process can be prevented and impurities can pass through the filling layer 117b in a subsequent memory cell impurity implantation process. A step between the top surface of the filling layer 117b and the top surface of the first and the second gates DG and CG is lower than a step between the top surface of semiconductor substrate 101 and the top surface of the first and the second gates DG and CG before the filling layer 117b is formed. Furthermore, the aspect ratio of an interval between the second gates CG adjacent to each other, opened by the filling layer 117b remaining after the etch process, is improved, that is reduced, before the filling layer 117b is formed.

Figure 3G:
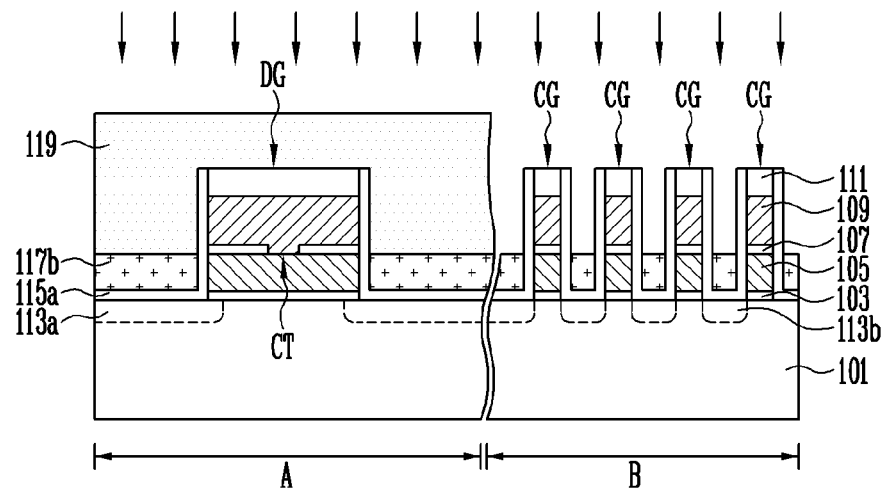

Referring to FIGS. 2 and 3G, at step S17, a mask pattern 119 is formed such that, the top of the first region A is blocked, but the top of the second region B is left exposed or open. The mask pattern 119 may be a photoresist pattern formed by a photolithography process. The mask pattern 119 may also be formed by removing the exposed region of a mask layer using an etch process that uses a photoresist pattern as an etch mask. The mask pattern 119 is formed with the filling layer 117b remaining between the second gates CG adjacent to each other. The filling layer 117b is made of material different from the mask layer and the mask pattern 119 and, the filling layer 117b is not removed by a process of removing the exposed region of the mask layer.

The photolithography process includes forming a photoresist layer, exposing the selected region of the photoresist layer, removing the exposed region or the non-exposed region of the photoresist layer, and a cleaning process. After the selected region of the photoresist layer is exposed, the exposed region or the non-exposed region of the photoresist layer may be removed using a developer. If the photoresist layer is a positive type, the exposed region of the photoresist layer is removed. If the photoresist layer is a negative type, the non-exposed region of the photoresist layer is removed.

If the mask pattern 119 is a photoresist pattern, when the photoresist layer is removed by the developer, the developer dissolves the photoresist layer, and the developer is filled in the interval between the second gates CG adjacent to each other in a region from which the photoresist layer will be removed and is then discharged. Furthermore, if the cleaning process is performed using wet cleaning using a cleaning agent, the cleaning agent may fill the interval between the second gates CG adjacent to each other and is then discharged. Although interfacial tension is generated because of the developer and the cleaning agent, the filling layer 117b according to this disclosure is not removed by the developer or the cleaning agent. Accordingly, the aspect ratio of the interval between the second gates CG is reduced because the filling layer 117b remains between the second gates CG adjacent to each other.

As described above, according to this disclosure, stress resulting from interfacial tension, applied to the second gates CG, may be reduced because the photolithography process is performed in the state where the aspect ratio of the interval between the second gates CG has been reduced. Accordingly, this disclosure may improve a phenomenon in which the second gates CG are collapsed or inclined owing to the stress resulting from the interfacial tension.

If the mask pattern 119 is a pattern formed by etching the exposed region of the mask layer through wet etching using the photoresist pattern as an etch mask, an etchant is filled in the interval between the second gates CG adjacent to each other in a region from which the mask layer may be removed. Although interfacial tension may be generated by a wet solution, the filling layer 117b of this disclosure is not removed by the wet solution. Thus, the aspect ratio of the interval between the second gates CG is reduced because the filling layer 117b remains between the second gates CG adjacent to each other.

As described above, stress of interfacial tension, applied to the second gates CG, may be reduced because the wet etch process is performed in the state where the aspect ratio of the interval between the second gates CG has been reduced. Accordingly, this disclosure may improve a phenomenon in which the second gates CG are collapsed or inclined owing to the stress resulting from the interfacial tension.

After the mask pattern 119 is formed, impurities for memory cells are implanted at step S19. The implantation of the impurities for the memory cells may comprise forming a cell junction (hereinafter referred to as a 'second impurity region 113b') in the semiconductor substrate 101 between the second gates CG adjacent to each other. The implantation of the impurities for the memory cells is performed by using a process tuned by taking into consideration the first impurity regions, formed in the second region B in the LDD impurity implantation process.

The implantation of the impurities for the memory cells does not have an effect on the first impurity regions 113a formed in the first region A because the implantation is performed by using the mask pattern 119 as an impurity implantation mask. The implantation of the impurities for the memory cells includes implanting first impurities for controlling threshold voltages of the memory cells and implanting second impurities for forming the second impurity regions 113b by using the second region B as a target.

In an embodiment, implantation of the first impurities may be performed by implanting boron (B) having a dose of 1E12 ions/cm$^2$ to 5E13 ions/cm$^2$ with energy of 10 KeV to 50 KeV.

In an embodiment, implantation of the second impurities may be performed by implanting arsenic (As) having a dose of 1E12 ions/cm$^2$ to 1E13 ions/cm$^2$.

When impurities for the memory cells are implanted, the second gates CG play the role of a mask for precluding the impurities from being implanted into the semiconductor substrate 101 under the second gates CG. When the impurities for the memory cells are implanted, the impurities pass through the remaining filling layer 117b. Accordingly, the second impurity region 113b is formed in the semiconductor substrate 101 between the second gates CG adjacent to each other in the second region B.

Figure 3H:
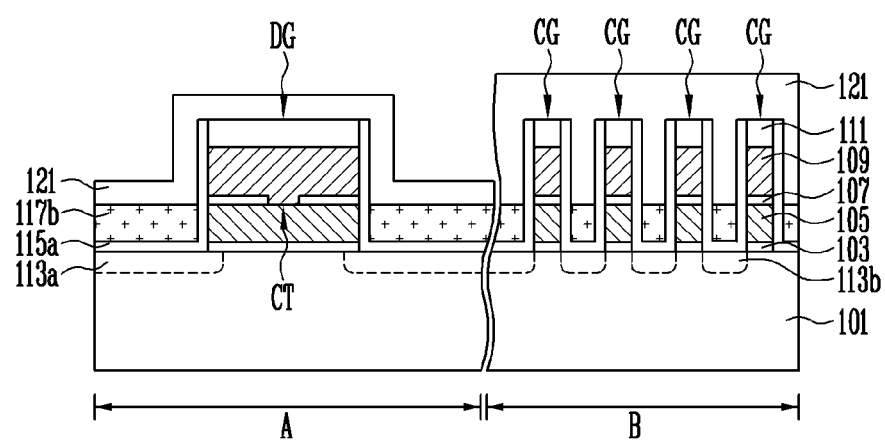

Referring to FIGS. 2 and 3H, after the second impurity regions 113b are formed, the mask pattern 119 is removed. At step S21, a spacer layer 121 is formed on a surface of the filling layer 117b including the first and the second gates DG and CG. The space between the second gates CG may be buried or covered with the spacer layer 121. The spacer layer 121 may be formed of an insulating layer.

Although not shown, the spacer layer 121 is etched by an etch process, such as etch-back, so that spacers remain on the sidewalls of the first gates DG and the second gates CG. Here, the spacer layer 121 filled between the second gates CG is not removed, but may remain with it filled between the second gates CG.

Next, when impurities are implanted by using the spacers and the first and the second gates DG and CG as a mask, a third impurity region having a higher concentration than the first impurity region 113a is formed on one side of the first impurity region 113a of the first region A which has not been blocked by the spacers. Accordingly, the junction of an LDD structure, including the first and the third impurity regions, may be formed in the first region A.

Next, an interlayer dielectric layer is formed, and an etch process may form a contact hole through which the third impurity region is exposed. Here, if the interlayer dielectric layer and the filling layer 117b are made of the same material, the etch process for forming the contact hole can be simplified.

As described above, according to this disclosure, after the aspect ratio of an interval between the plurality of patterns is lowered by filling some of the interval between the plurality of patterns the filling layer, mask patterns for a subsequent process are formed. Accordingly, stress resulting from interfacial tension, applied to the patterns, may be prevented in a process of forming the mask patterns. Accordingly, this disclosure may improve a phenomenon in which shapes of the patterns are deformed owing to stress generated in a process of forming the mask patterns.

This disclosure is not limited and applied to the process of forming the memory cell junctions of the NAND flash memory device, but may be applied to any semiconductor device manufacturing process, including a process of forming a mask pattern through which the selected region of a semiconductor substrate is exposed after forming a plurality of patterns.

What is claimed is:

1. A method of manufacturing semiconductor devices, comprising
   forming a plurality of patterns spaced apart from each other on a semiconductor substrate;
   forming capping patterns having a U shape between adjacent patterns;
   forming filling patterns on the capping patterns, wherein the filling patterns have a lower height than a height of the plurality of patterns;
   forming a mask layer on an entire structure where the filling patterns are formed;
   forming the mask pattern by removing some of the mask layer so that some of the plurality of patterns is exposed; and
   implanting impurities into the semiconductor substrate under the filling patterns exposed by the mask pattern.

2. The method of claim 1, wherein forming the capping patterns and the filling patterns comprise:
   forming a capping layer on exposed surfaces of the plurality of patterns and the semiconductor substrate;
   forming a filling layer, having a first height higher than the height of the plurality of patterns, over the capping layer so that the filling layer is filled between the plurality of patterns;
   polishing the filling layer by using a polishing process that exposes the capping layer;
   forming the capping patterns by removing an exposed region of the capping layer; and
   forming the filling patterns by etching the polished filling layer.

3. The method of claim 2, wherein:
   the capping layer is a nitride layer, and the filling layer is an oxide layer.

4. The method of claim 2, wherein the capping layer is formed in thickness of 20 Å to 50 Å.

5. The method of claim 1, wherein the mask layer is a photoresist layer and is removed by a developer.

6. A method of manufacturing semiconductor devices, comprising:
   forming a first gate and second gates over a substrate, wherein the first gate is arranged in a first region of the substrate, and the second gates are arranged in a second region of the substrate;
   forming capping patterns having a U shape between the first gate and the second gate adjacent to each other, and between the second gates;
   forming filling pattern on the capping patterns, wherein the filling patterns have a lower height than the first gate and the second gates;
   forming a mask pattern blocking a top surface of the first region and opening a top surface of the second region; and
   implanting impurities into the second region of the semiconductor substrate under the filling pattern exposed by the mask pattern.

7. The method of claim 6, wherein forming the mask pattern comprises:
   forming a mask layer over the first and the second regions; and
   removing some of the mask layer so that the top surface of the second region is opened and the filling patterns remains.

8. The method of claim 6, further comprising implanting impurities into the first and the second regions of the substrate by using the first gate and the second gates as a mask, before forming the filling patterns.

9. The method of claim 8, wherein implanting the impurities into the first and the second regions further comprises implanting phosphorous (P) or arsenic (As) at a dose of 1E12 ions/cm$^2$ to 1E13 ions/cm$^2$.

10. The method of claim 8, wherein the impurity implantation process further comprises:
    implanting first impurities for controlling threshold voltages of the memory cells; and
    implanting second impurities for forming junctions of the memory cells.

11. The method of claim 10, wherein implanting the first impurities is performed using boron (B) at a dose of 1E12 ions/cm$^2$ to 5E13 ions/cm$^2$ dose with energy of 10 KeV to 50 KeV.

12. The method of claim 10, wherein implanting the second impurities is performed by using arsenic (As) at a dose of 1E12 ions/cm$^2$ to 1E13 ions/cm$^2$.

13. The method of claim 6, wherein forming the capping patterns and the filling patterns comprise:
   forming a capping layer on exposed surfaces of the first and the second gates and the substrate;
   forming a filling layer, formed to have a first height higher than the height of the first and the second gates and made of a different material from the mask pattern, over the capping layer so that the filling layer is filled between the first gate and the second gate adjacent to each other, and between the second gates;
   polishing the filling layer having the first height by using a polishing process that exposes the capping layer;
   forming the capping patterns by removing an exposed region of the capping layer; and
   forming the filling patterns by etching the polished filling layer.

14. The method of claim 13, wherein:
   the capping layer is a nitride layer, and the filling layer is an oxide layer.

15. The method of claim 14, wherein the oxide layer is made of low-pressure tetraethly orthosilicate (LP-TEOS).

16. The method of claim 13, wherein the capping layer is formed by low pressure-chemical vapor deposition (LP-CVD).

17. The method of claim 13, wherein the capping layer is formed in thickness of 20Å to 50 Å.

18. The method of claim 6, wherein the filling patterns having the lower height than the first and the second gates are 100Å to 500Å in height.

19. A method of manufacturing semiconductor devices, comprising:
   forming a first gate and second gates over a semiconductor substrate, wherein the first gate arranged in a first region of the substrate, and the second gates arranged in a second region of the substrate;
   forming a first impurity region in the first and the second regions by a blanket impurity implantation process using the first and the second gates as a mask;
   forming capping patterns having a U shape between the first and the second gate adjacent to each other and between the second gates;
   forming a filling patterns on the capping patterns, having a lower height than the first and the second gates;
   forming a photoresist pattern, blocking a top surface of the first region, but opening a top surface of the second region, by a photolithography process; and
   forming a second impurity region in the second region under the filling patterns exposed by the photoresist pattern.

* * * * *